(12) United States Patent
Jumpertz et al.

(10) Patent No.: US 7,436,003 B2
(45) Date of Patent: Oct. 14, 2008

(54) VERTICAL THYRISTOR FOR ESD PROTECTION AND A METHOD OF FABRICATING A VERTICAL THYRISTOR FOR ESD PROTECTION

(75) Inventors: Reiner Jumpertz, Freising (DE); Klaus Schimpf, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 428 days.

(21) Appl. No.: 11/347,622

(22) Filed: Feb. 3, 2006

(65) Prior Publication Data
US 2006/0175629 A1 Aug. 10, 2006

(30) Foreign Application Priority Data
Feb. 10, 2005 (DE) .................. 10 2005 006 121

(51) Int. Cl.
*H01L 29/74* (2006.01)
(52) U.S. Cl. .................. 257/107; 257/E29.211; 438/133
(58) Field of Classification Search .................. 257/107, 257/E29.211; 438/133
See application file for complete search history.

(56) References Cited

U.S. PATENT DOCUMENTS

| | | | |
|---|---|---|---|
| 5,815,359 A | 9/1998 | Maytum et al. | |
| 6,770,918 B2 * | 8/2004 | Russ et al. | 257/173 |
| 6,780,725 B2 | 8/2004 | Fujimaki | |
| 6,803,259 B2 * | 10/2004 | Lee | 438/133 |
| 2007/0023866 A1 * | 2/2007 | Chatty et al. | 257/575 |

FOREIGN PATENT DOCUMENTS

DE 38 35 569 A1 5/1990

* cited by examiner

*Primary Examiner*—Trung Dang
(74) *Attorney, Agent, or Firm*—Jacqueline J. Garner; W. James Brady, III; Frederick J. Telecky, Jr.

(57) ABSTRACT

A vertical thyristor for ESD protection comprises an anode (10), a cathode (16), a first gate electrode (12) and a second gate electrode (14). The first (12) and second (14) gate electrodes are arranged between the anode (10) and the cathode (16), wherein the first gate electrode (12) is an epitaxial silicon layer (20) formed upon the anode (10) and the second gate electrode (14) is an epitaxial silicon-germanium layer (24) formed upon the first gate electrode (12). The method of fabricating such a vertical thyristor comprises the steps of depositing an epitaxial silicon layer (20) upon the anode (10) and depositing an epitaxial silicon-germanium layer (24) upon the epitaxial silicon layer (20), wherein the epitaxial silicon layer (20) forms the first gate electrode (12) and the epitaxial silicon-germanium layer (24) forms the second gate electrode (14) of the vertical thyristor.

19 Claims, 3 Drawing Sheets

US 7,436,003 B2

VERTICAL THYRISTOR FOR ESD PROTECTION AND A METHOD OF FABRICATING A VERTICAL THYRISTOR FOR ESD PROTECTION

FIELD OF THE INVENTION

The present invention relates to a vertical thyristor for ESD protection comprising an anode, a cathode, a first gate electrode and a second gate electrode which are arranged between the anode and the cathode. The present invention further relates to a method of fabricating a vertical thyristor for ESD protection.

BACKGROUND OF THE INVENTION

Electrostatic discharge (ESD) is a common phenomenon that occurs during handling of semiconductor IC (integrated circuit) devices. Electrostatic charges may accumulate for various reasons and cause damage to an IC device. Typically, damage can occur during a testing phase of the IC fabrication, during assembly of the IC to the circuit board, as well as during the use of equipment into which the IC has been installed. The built-up electrostatic charge may be quickly discharged thereby causing significant damage to the IC, e.g. due to dielectric breakdown of oxides and/or due to high levels of conduction through relatively small areas of the circuit arising from reverse breakdown of p-n junctions of the circuit.

To reduce the sensitivity of integrated circuits to electrostatic discharge, integrated circuits with protection devices at their external terminals are designed which provide a "safe" path for the electrostatic charge to follow. Such a safe path is designed in a manner that no damage occurs when electrostatic discharge occurs from a charged body to the integrated circuit. Upon the occurrence of an ESD the built-up electrostatic charge is discharged via the ESD protection device thus preventing damage of the integrated circuit to be protected. For reasons of low cost it is desirable that the fabrication of such a protection device can be integrated into existing process flows. Further, the ESD protection device should reliably avoid damage of the IC device to be protected, at all events and for the whole period of manufacture and use of the integrated circuit.

SUMMARY OF THE INVENTION

The present invention provides a vertical thyristor for ESD protection which reliably avoids damage of the integrated circuit to be protected.

According to the present invention the first gate electrode is an epitaxial silicon layer formed upon the anode and the second gate electrode is an epitaxial silicon-germanium (SiGe) layer formed upon the epitaxial silicon layer. The epitaxial silicon-germanium layer controls the switching speed of the thyristor. The electrical properties of the SiGe, i.e. the high electron and hole mobility, lead to significantly improved characteristics compared to ESD protection devices known from prior art, especially to high switching speeds and high current capability. The high switching speed ensures that in the case of an ESD event the electrostatic charge is more or less immediately discharged by the thyristor before the electronic circuit to be protected might be damaged. The high current capability ensures that the device withstands the high current levels during the ESD event. Due to the vertical combination of the npn and pnp junctions the design density can be increased compared with structures in which the npn and pnp junctions are separately used. Further, due to the vertical structure the capacity of the thyristor is reduced which is advantageous for RF applications, e.g. for RF input pads. Additionally, the generally higher current gain $h_{FE}$ of the vertical structure in comparison to that of a lateral structure results in lower resistance during an ESD event which reduces power consumption so that the device can withstand higher voltages.

The present invention further provides a method of fabricating a vertical thyristor for ESD protection with improved characteristics.

According to the method of the present invention, an epitaxial silicon layer is deposited upon the anode and an epitaxial silicon-germanium layer is deposited upon the epitaxial silicon layer, wherein the epitaxial silicon layer forms the first gate electrode and the epitaxial silicon-germanium layer forms the second gate electrode of the vertical thyristor. Since the first and second gate electrodes are fabricated by the deposition of epitaxial layers, layers of highest quality can be grown the characteristics of which, for example the thickness and doping gradient, can be chosen as desired. The epitaxial SiGe layer is preferably deposited so as to be very thin compared to the epitaxial silicon layer. The thickness of the epitaxial SiGe layer is preferably about 100 nm. The electrical properties of the SiGe material, i.e. the high electron and hole mobility, lead to a high switching speed of the thyristor.

The present invention further relates to an integrated circuit which both comprises an npnp thyristor and a pnpn thyristor according to the present invention. Due to the combination of the two thyristor types reliable protection against both positive and negative charge is achieved. By way of example, one of the thyristors is then connected to VCC and the other thyristor is connected to ground, or alternatively, both thyristors are parallel connected to ground.

BRIEF DESCRIPTION OF THE DRAWINGS

Further features and advantages of the invention read from the following description of a preferred embodiment in accordance with the present invention and with reference to the drawings in which.

DETAILED DESCRIPTION OF THE EMBODIMENTS

Figure 1:
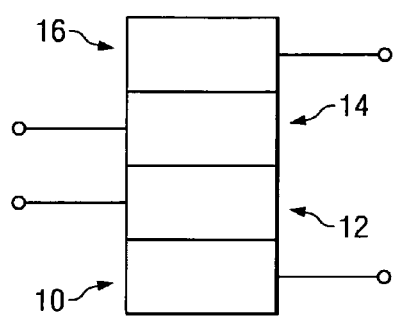
FIG. 1 schematically shows the fundamental structure of a preferred vertical thyristor according to the present invention, FIGS. 2 to 7 schematically show the preferred method steps for manufacturing the preferred vertical thyristor.

FIG. 1 schematically shows a preferred embodiment of the vertical thyristor for ESD protection according to the present invention. The device comprises an anode 10, a first gate electrode 12, a second gate electrode 14 and a cathode 16. The anode 10 is formed by a p-doped diffusion under film (PDUF) layer. Upon the anode 10 a low n-doped epitaxial silicon layer is formed which is the first gate electrode 12 of the device. Upon the first gate electrode 12 a p-doped epitaxial silicon-germanium layer is formed which is the second gate electrode 14 of the device. The cathode 16 is formed by an n-doped polysilicon layer.

FIGS. 2 to 7 schematically illustrate the preferred method for manufacturing the preferred vertical thyristor according to the present invention.

Figure 2:
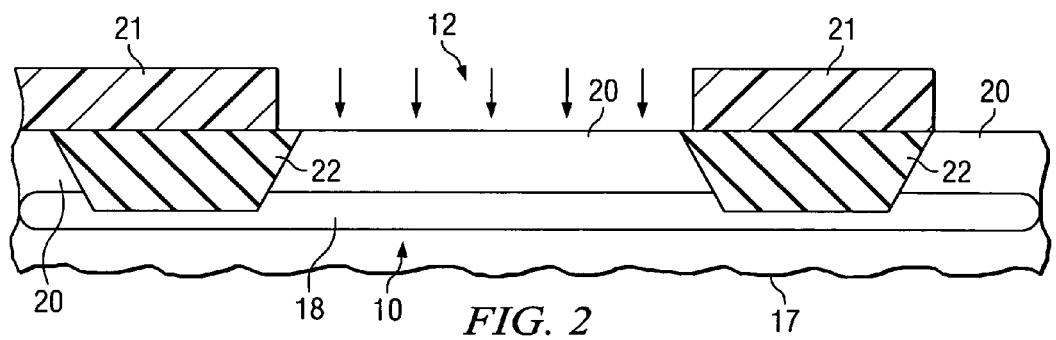
Figure 3:
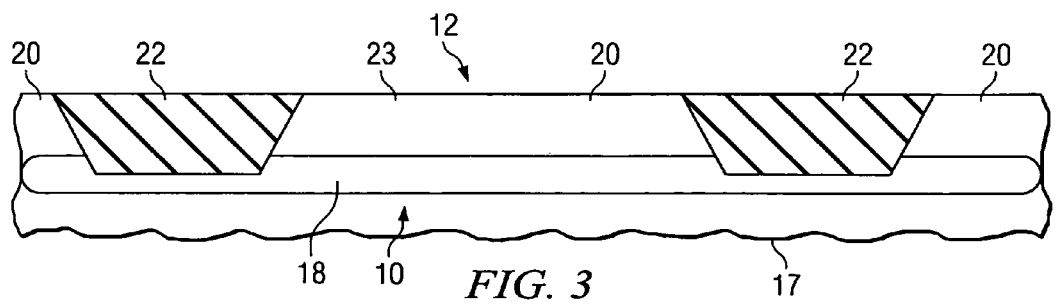

As is seen in FIGS. 2 and 3 of the drawings, a p-doped diffusion under film (PDUF) layer 18 is created in a silicon substrate 17 by an implantation step and subsequent diffusion of the implanted p-dopants. The PDUF layer 18 acts as the anode 10 of the protection device. After formation of the PDUF layer 18, a relatively thick n-doped epitaxial silicon layer 20 is deposited. The epitaxial silicon layer 20 is low in-situ doped. The next process step is the field isolation in which pads of thick oxide 22 are thermally grown for isolating the active region of the thyristor from adjacent devices. Typical processes for the field isolation are the LOCOS (Local Oxidation Of Silicon) process and the STI (Shallow Trench Isolation) process. In the LOCOS process, for example, silicon nitride is used as a mask and oxide grows in those areas which are not protected by the silicon nitride. After the field isolation an n-well 23 is created in the epitaxial silicon layer 20 by implanting the active region between the pads of thick oxide 22 with n-dopants (as indicated by the arrows in FIG. 1) while protecting the other regions through a patterned resist layer 21 which is removed afterwards. The n-well 23 forms the first gate electrode 12 of the device.

Figure 4:
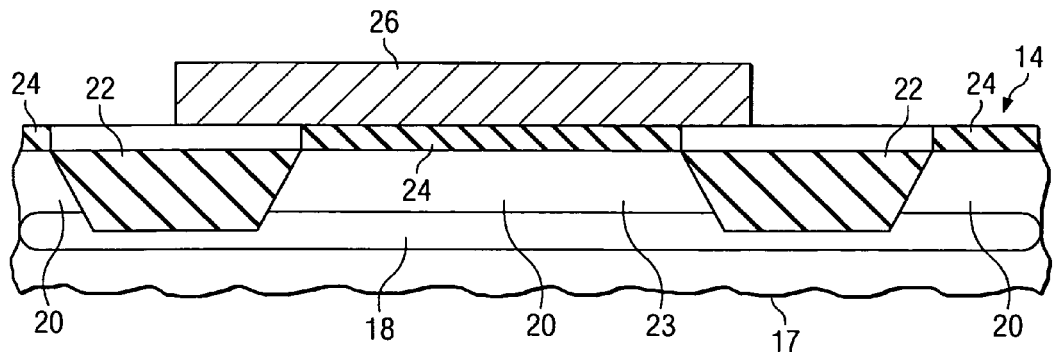
Figure 5:
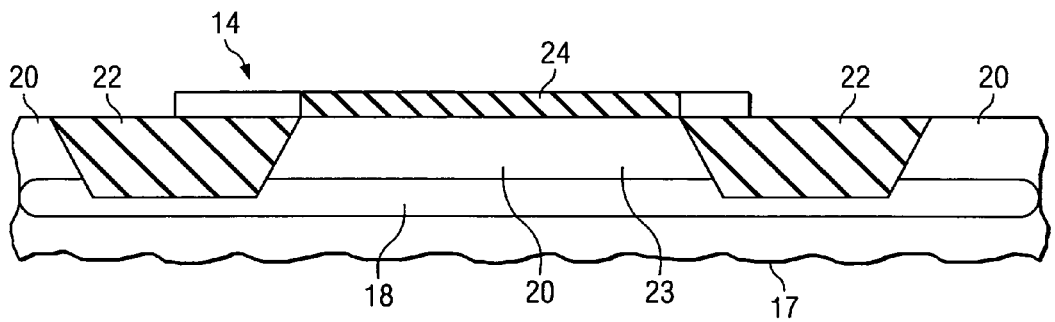
Figure 6:
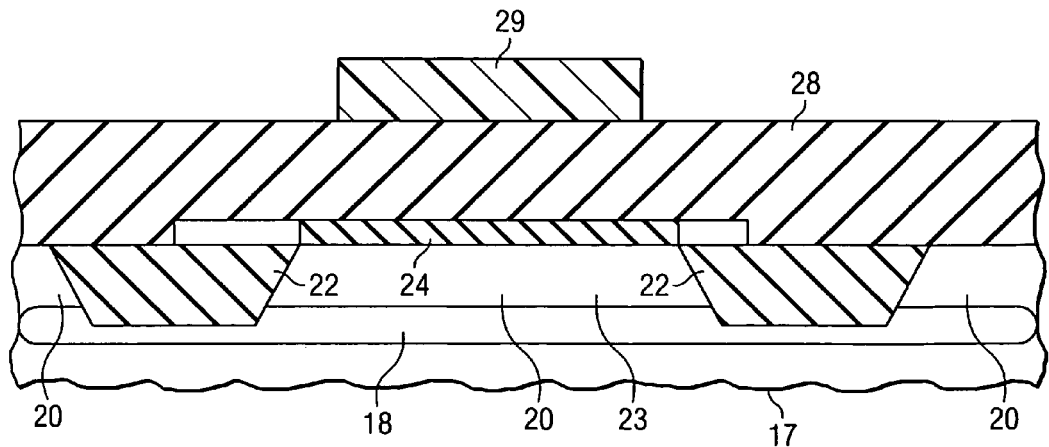
Figure 7:
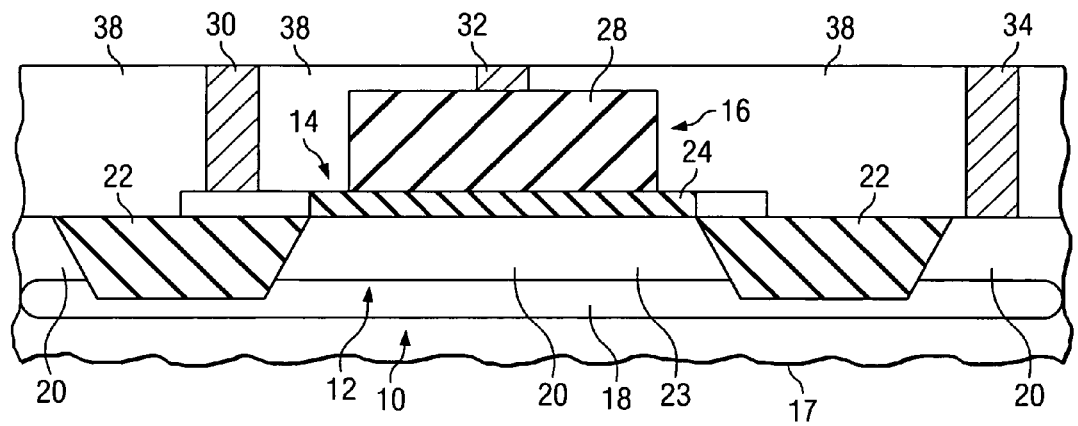

As can be seen in FIGS. 4 and 5 of the drawings, the field isolation process is followed by depositing an epitaxial p-doped silicon-germanium layer 24 which forms the second gate electrode 14 of the device. On top of the isolation oxide, this epi growths as polysilicon (non-selective epi). The silicon-germanium layer 24 preferably has a thickness of about 100 nm. The silicon-germanium layer 24 is patterned by applying a photoresist layer 26 on the p-doped silicon-germanium layer 24, exposing the resist 26 which is not covered by a mask (not shown here), developing the resist 26, etching the regions of the silicon-germanium layer 24 which are not covered by the resist 26 and removing of the remaining photoresist 26. After that a polysilicon layer 28 (FIG. 6) is deposited and n-doped (either insitu or by implant) which forms the cathode 16 of the thyristor. The polysilicon layer 28 is patterned by applying a photoresist 29 so as to partially cover the epitaxial silicon-germanium layer 24. Lateral isolation between the cathode 16 and the second gate electrode 14 is not shown here to simplify matters (standard 15 spacer concepts can be used). Metal interconnects 30, 32, 34, 36 to the outside of the thyristor device are made with a standard one layer metal process as known from prior art. The metal interconnects 30, 32, 34, 36 are separated from each other by an insulating layer 38 which is, for example, made of BPSG (boron phosphorus silicate glass).

Figure 8:
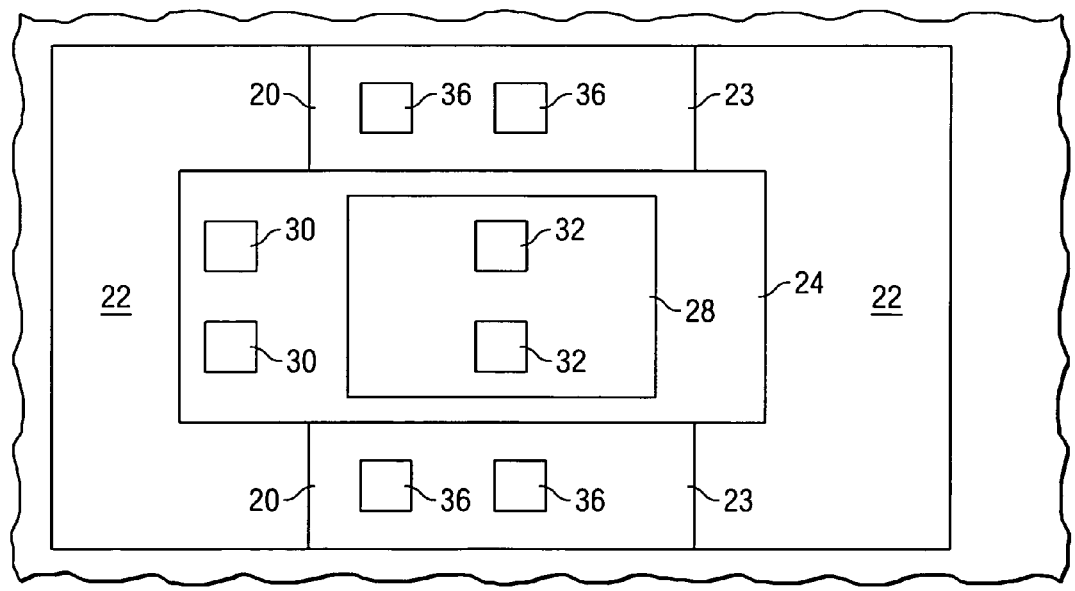
FIG. 8 shows in a schematic manner the preferred thyristor from a top view.

FIG. 8 shows a top view of the manufactured vertical thyristor. As can be seen, the patterned silicon-germanium layer 24 partially covers the underlying n-doped well 23 of the silicon layer 20 and the pads of thick oxide 22, and the polysilicon layer 28 partially covers the underlying silicon-germanium layer 24. Further, the metal interconnects 36 to the silicon layer, the metal interconnects 30 to the silicon-germanium layer and the metal interconnects 32 to the polysilicon layer can be seen.

The above device as described is an npnp thyristor, i.e. a thyristor with a p-doped anode. Alternatively, the thyristor according to the present invention is a pnpn thyristor, i.e. a thyristor with an n-doped anode. The pnpn thyristor according to the present invention is manufactured with the same process steps as described above for the npnp thyristor, solely by changing the type of dopant, i.e. n-dopant with p-dopant and vice versa.

According to a further aspect of the present invention, an integrated circuit is provided which both comprises an npnp thyristor and a pnpn thyristor according to the present invention. Due to the combination of the two thyristor types reliable protection against both positive and negative charge is achieved. By way of example, one of the thyristors is connected to VCC and the other thyristor is connected to ground, or alternatively, both thyristors are parallel connected to ground.

The vertical thyristor according to the present invention allows much higher switching speed with high current capability compared with ESD protection devices known from the prior art. The high switching speed and high current capability of the ESD protection device according to the present invention are attained through the very thin silicon-germanium layer 24 forming the second gate electrode 14. The electrical properties of the SiGe material, i.e. the high electron and hole mobility, lead to significantly improved speed characteristics. The high switching speed ensures that in the case of an ESD event the electrostatic charge is immediately discharged by the vertical thyristor acting as an ESD protection device before the electronic circuit to be protected might be damaged. The high current capability ensures that the thyristor device withstands the high current levels usually inherent with an ESD event.

Due to the vertical combination of the npn and pnp junctions (thyristor) the design density can be increased compared with structures in which the npn and pnp junctions are separately used (bipolar). The vertical thyristor according to the present invention thus complies with the principal aim of reduced feature size in order to maintain competitiveness in the international marketplace. Additionally, the generally higher current gain $h_{FE}$ of the vertical structure in comparison to that of a lateral structure results in lower resistance during an ESD event which reduces power consumption and therefore leads to a higher ESD voltage.

The process for manufacturing the vertical thyristor according to the present invention can be easily integrated into existing process flows, for example into existing BICMOS and RF processes. Alternatively, the process for manufacturing the vertical thyristor can also be a stand-alone process. Especially in complementary BICMOS processes, that support vertical npn structures as well as vertical pnp structures, this ESD device can be integrated without any additional process steps into existing process flows.

The invention claimed is:

1. A vertical thyristor for ESD protection, comprising an anode (10), a cathode (16), a first gate electrode (12) and a second gate electrode (14), said first (12) and second (14) gate electrodes being arranged between said anode (10) and said cathode (16), wherein said first gate electrode (12) is an epitaxial silicon layer (20) formed upon the anode (10) and said second gate electrode (14) is an epitaxial silicon-germanium layer (24) formed upon said epitaxial silicon layer (20).

2. The vertical thyristor according to claim 1, wherein said epitaxial silicon layer (20) forming said first gate electrode (12) is n-doped.

3. The vertical thyristor according to claim 1, wherein said epitaxial silicon-germanium layer (24) forming said second gate electrode (14) is p-doped.

4. The vertical thyristor according to claim 1, wherein said cathode (16) is an n-doped polysilicon layer (28).

5. The vertical thyristor according to claim 1, wherein said epitaxial silicon layer (20) forming said first gate electrode (12) is p-doped.

6. The vertical thyristor according to claim 1, wherein said epitaxial silicon-germanium layer (24) forming said second gate electrode (14) is n-doped.

7. The vertical thyristor according to claim 1, wherein said cathode (16) is a p-doped polysilicon layer (28).

8. The vertical thyristor according to claim 1, wherein said epitaxial silicon layer (20) forming said first gate electrode

(12) is thicker than said epitaxial silicon-germanium layer (24) forming said second gate electrode (14).

9. The vertical thyristor according to claim 1, wherein said epitaxial silicon-germanium layer (24) has a thickness of about 100 nm.

10. An integrated circuit comprising:

a first vertical thyristor comprising an anode (10), a cathode (16), a first gate electrode (12) and a second gate electrode (14), said first and second gate electrodes being arranged between said anode and said cathode, wherein said first gate electrode (12) is an n-doped epitaxial silicon layer (20) formed upon the anode (10) and said second gate electrode (14) is a p-doped epitaxial silicon-germanium layer (24) formed upon said n-doped epitaxial silicon layer (20) and wherein said cathode (16) is an n-doped polysilicon layer (28);

and a second vertical thyristor comprising an anode (10), a cathode (16), a first gate electrode (12) and a second gate electrode (14), said first and second gate electrodes being arranged between said anode and said cathode, wherein said first gate electrode (12) is an p-doped epitaxial silicon layer (20) formed upon the anode (10) and said second gate electrode (14) is a n-doped epitaxial silicon-germanium layer (24) formed upon said p-doped epitaxial silicon layer (20) and wherein said cathode (16) is a p-doped polysilicon layer (28).

11. The integrated circuit according to claim 10, wherein at least one of said silicon layers (20) forming said first gate electrode (12) of said first or second thyristor is thicker than said epitaxial silicon-germanium layer (24) forming said second gate electrode (14) of said first or second thyristor.

12. The integrated circuit according to claim 10, wherein at least one of said epitaxial silicon-germanium layers (24) of said first or second thyristor has a thickness of about 100 nm.

13. A method of fabricating a vertical thyristor for ESD protection, said vertical thyristor comprising an anode (10), a cathode (16), a first gate electrode (12) and a second gate electrode (14), said method comprising the steps of depositing an epitaxial silicon layer (20) upon said anode (10) and depositing an epitaxial silicon-germanium layer (24) upon said epitaxial silicon layer (20), said epitaxial silicon layer (20) forming said first gate electrode (12) and said epitaxial silicon-germanium layer (24) forming said second gate electrode (14) of said thyristor.

14. The method according to claim 13, wherein said cathode (16) is a polysilicon layer (28) formed on said second gate electrode (14).

15. The method according to claim 13, wherein deposition of said epitaxial silicon layer (20) and said epitaxial silicon-germanium layer (24) is made such that said first gate electrode (12) is thicker than said second gate electrode (14).

16. The method according to claim 13, wherein said epitaxial silicon layer (20) forming said first gate electrode (12) is in-situ n-doped.

17. The method according to claim 13, wherein said epitaxial silicon-germanium layer (24) forming said second gate electrode (14) is in-situ p-doped.

18. The method according to claim 13, wherein said epitaxial silicon layer (20) forming said first gate electrode (12) is in-situ p-doped.

19. The method according to claim 13, wherein said epitaxial silicon-germanium layer (24) forming said second gate electrode (14) is in-situ n-doped.

* * * * *